(12) United States Patent
Craen et al.

(10) Patent No.: US 11,231,528 B2
(45) Date of Patent: Jan. 25, 2022

(54) LENS ASSEMBLY FOR OPTICAL IMAGE STABILIZATION AND FOCUS ADJUSTMENT

(71) Applicant: poLight ASA, Horten (NO)

(72) Inventors: Pierre Craen, Embourg (BE);
Vladimir Kartashov, Horten (NO);
Janne Tapani Kilpinen, Akaa (FI);
Nicolas Tallaron, Lyons (FR); Lars Henriksen, Tønsberg (NO)

(73) Assignee: poLight ASA, Horten (NO)

( * ) Notice: Subject to any disclaimer, the term of this patent is extended or adjusted under 35 U.S.C. 154(b) by 100 days.

(21) Appl. No.: 16/623,726

(22) PCT Filed: Jun. 28, 2018

(86) PCT No.: PCT/EP2018/067511
§ 371 (c)(1),
(2) Date: Dec. 17, 2019

(87) PCT Pub. No.: WO2019/002524
PCT Pub. Date: Jan. 3, 2019

(65) Prior Publication Data
US 2021/0141126 A1     May 13, 2021

(30) Foreign Application Priority Data

Jun. 30, 2017   (EP) .................................... 17179006
Jun. 30, 2017   (EP) .................................... 17179023

(51) Int. Cl.
*G02B 26/00*   (2006.01)
*G02B 3/14*   (2006.01)
(Continued)

(52) U.S. Cl.
CPC ............. *G02B 3/14* (2013.01); *G02B 26/004* (2013.01); *G02B 26/0858* (2013.01);
(Continued)

(58) Field of Classification Search
CPC ... G02B 3/14; G02B 3/00; G02B 3/12; G02B 26/004; G02B 26/00; G02B 26/0858;
(Continued)

(56) References Cited

U.S. PATENT DOCUMENTS 8,072,689 B2    12/2011  Bolis
8,282,004 B2 *  10/2012  Wang ...................... G02B 3/14
                                                     235/470

(Continued)

FOREIGN PATENT DOCUMENTS

CN      101688976 B      7/2012
CN      105005103 A     10/2015
(Continued)

OTHER PUBLICATIONS

International Search Report for PCT/EP2018/067511 dated Aug. 14, 2018.
Office Action for CN 201880056027.9 dated May 24, 2021.

*Primary Examiner* — William R Alexander
(74) *Attorney, Agent, or Firm* — Knobbe Martens Olson & Bear LLP

(57) ABSTRACT

The invention relates to an adjustable or tuneable lens assembly where a deformable, non-fluid lens body is sandwiched between a bendable lens cover and a back window to form a lens. The lens assembly has an actuator system with a plurality of individually addressable actuators for applying force to the lens cover in direction along the optical axis to change an overall shape of the lens. The actuator system has a focus adjustment mode to adjust the optical power of the lens and an optical image stabilisation mode, which are configured to operate simultaneously by addressing each actuator to apply a force being at least substantially a sum of the forces that would be applied in these modes.

19 Claims, 8 Drawing Sheets

(51) Int. Cl.
  *G02B 26/08* (2006.01)
  *H01L 41/08* (2006.01)
  *H01L 41/09* (2006.01)
  *G02B 27/64* (2006.01)
  *G02C 7/08* (2006.01)

(52) U.S. Cl.
  CPC ............ *G02B 27/646* (2013.01); *G02C 7/085* (2013.01); *H01L 41/0825* (2013.01); *H01L 41/098* (2013.01)

(58) Field of Classification Search
  CPC ...... G02B 27/646; G02B 27/64; G02C 7/085; G02C 7/08; G02C 7/02; H01L 41/0825; H01L 41/08; H01L 41/098
  USPC .......................................................... 359/665
  See application file for complete search history.

(56) References Cited

U.S. PATENT DOCUMENTS

| | | | |
|---|---|---|---|
| 8,422,142 B2* | 4/2013 | Bolis | G02B 7/08 359/665 |
| 9,405,045 B2* | 8/2016 | Lee | G02B 7/028 |
| 9,581,809 B2* | 2/2017 | Ackley | G02B 5/005 |
| 10,222,514 B2* | 3/2019 | Ackley | G02B 3/14 |
| 2010/0128357 A1* | 5/2010 | Szilagyi | G02B 27/646 359/666 |
| 2010/0182703 A1* | 7/2010 | Bolis | G02B 26/0825 359/666 |
| 2010/0208194 A1 | 8/2010 | Gupta et al. | |
| 2010/0276492 A1* | 11/2010 | Wang | G02B 3/14 235/470 |
| 2011/0149409 A1* | 6/2011 | Haugholt | G02B 3/14 359/666 |
| 2011/0158617 A1* | 6/2011 | Svardal | G03B 5/02 396/55 |
| 2012/0069450 A1* | 3/2012 | Bolis | G02B 13/0075 359/665 |
| 2012/0092775 A1* | 4/2012 | Duston | G02B 3/14 359/666 |
| 2012/0105971 A1* | 5/2012 | Lee | G02B 7/028 359/665 |
| 2016/0014339 A1* | 1/2016 | Miller | H04N 5/2257 348/208.6 |
| 2016/0131894 A1* | 5/2016 | Ackley | G06K 7/10811 359/738 |
| 2017/0045649 A1 | 2/2017 | Bolis | |
| 2018/0239063 A1* | 8/2018 | Ackley | G02B 7/08 |
| 2020/0355854 A1* | 11/2020 | Aschwanden | G02B 3/12 |

FOREIGN PATENT DOCUMENTS

| | | |
|---|---|---|
| CN | 105723251 A | 6/2016 |
| EP | 2122406 | 11/2009 |
| EP | 2239600 A1 | 10/2010 |
| JP | 2009-271095 A | 11/2009 |
| WO | WO 2008/035983 A1 | 3/2008 |
| WO | WO 2008/100153 A1 | 8/2008 |
| WO | WO 2008/100153 A8 | 8/2008 |
| WO | WO 2008/100154 A1 | 8/2008 |
| WO | WO 2009/010559 A1 | 1/2009 |
| WO | WO 2015/091836 A1 | 6/2015 |

* cited by examiner

LENS ASSEMBLY FOR OPTICAL IMAGE STABILIZATION AND FOCUS ADJUSTMENT

CROSS REFERENCE TO RELATED APPLICATIONS

This application is a U.S. National Phase Application of PCT International Application Number PCT/EP2018/067511, filed on Jun. 28, 2018, designating the United States of America and published in the English language, which is an International Application of and claims the benefit of priority to European Patent Application No. 17179023.1, filed on Jun. 30, 2017, and European Patent Application No. 17179006.6, filed on Jun. 30, 2017. The disclosures of the above-referenced applications are hereby expressly incorporated by reference in their entireties.

FIELD OF THE INVENTION

The invention relates to adjustable or tunable lens systems for optical devices such as compact cameras, in particular adjustable lens systems for aiding in optical image stabilization and focus adjustment.

BACKGROUND OF THE INVENTION

Autofocus (AF) and image stabilization are common features in most compact cameras, and there is an ongoing struggle to make systems performing such tasks smaller, cheaper, and more robust while simultaneously increasing the optical quality.

U.S. Pat. No. 5,315,435 presents a variable prism unit for transmitting and refracting a light beam to stabilize an image. The unit has two plates with a liquid there between, with one plate being fixed and actuators for pressing on the other plate to create an optical wedge that will refract a light beam. The variable prism unit does not provide any focusing capabilities, and additional optical elements are required for image formation and auto focus. Use of liquid for optical functionality is also known to be difficult and not compatible with high volume production of lenses for e.g. mobile phones.

WO 2008/100153 describes a device having both an image stabilizing arrangement and auto focus capabilities. The device has a flexible lens body sandwiched between a thin bendable cover involving a transparent prism and a thin bendable cover whose central region can be bend to form a lens. Both thin bendable covers involves actuators that can tilt the prism and adjust the focus length of the lens. The prism and the lens operates independently and the device thus needs two sets of actuators—one set on the cover on each side—and that the actuators are piezo electric actuators formed on the covers, which limits the size of the optical aperture or lead to cost ineffective solution since it will require increasing the size of the device.

In both image stabilization solutions mentioned above, the actuators operates in response to motion detectors in a camera, so that small movements of the camera are counteracted to move the image in the opposite direction so that the image does not move on the image sensor which are fixed inside the camera.

SUMMARY OF THE INVENTION

It is an object of the invention to provide a lens, which can be actuated with a simple yet effective actuation mechanism.

It is an alternative object of the invention to provide a lens assembly that is tunable and can be used in both optical image stabilization (OIS) and focus adjustment (FA).

It is another alternative object of the invention to provide such lens assembly where the same set of actuators and the same lens cover are used in both the optical image stabilization and the focus adjustment.

It is a further object of the invention to provide such lens assembly which is cost effective and makes larger optical apertures possible.

In a first aspect, the invention provides an optical lens assembly (1) comprising:
  a frame (6), a bendable transparent lens cover (4) and a transparent back window (3) connected to the frame, such as wherein the lens cover and/or the back window has a non-zero Sag;
  a transparent, deformable, non-fluid lens body (2) sandwiched between the lens cover and the back window (3) to form a lens having an optical axis (5) and a first optical power;
  an actuator system (7, 8) for applying force to the lens cover to change an overall shape of the lens, the actuator system comprising one or more, such as at least three, individually addressable actuators (7, 8) each being connected to the frame and adapted to apply force to the lens cover in a direction at least substantially along the optical axis (5);
  wherein the actuator system (7, 8) has a focus adjustment mode where the one or more, such as all, actuators are addressed to apply force to the lens cover (4) in the same direction to adjust the optical power/Sag of the lens; and/or
  wherein the actuator system (7, 8) has an optical image stabilisation mode where each of the one or more actuators are addressed to apply different forces to the lens cover (4) in a manner that varies along the rim of the lens cover to tilt the optical axis (5) of the lens,
  wherein the lens cover (4) comprises one or more stiffeners (24), such as ring-shaped stiffeners (23), on its circumferential section serving to distribute strain and non-symmetrical deformations around the optical axis resulting from the applied forces over larger areas of the lens cover (4),
  wherein the actuator system (7, 8) is arranged for displacing at least a part of, such as all of, the edge of the lens cover (4) with respect to the frame (6).

The present invention may be advantageous for providing a simple yet effective actuation mechanism. For example, the stiffener ring may enable distribution of strain and the displacement of the edge of the lens cover with respect to the frame may enable utilizing action-reaction forces of the lens body for shaping and/or tilting the lens cover. A single actuator may be employed, optionally with guiding means for guiding the lens cover upon (possibly non-rotationally around the optical axis) application of force form the single actuator. Multiple actuators may be beneficial for offering—such as via distributing them around the optical axis—tilting (in optical image stabilisation mode) and/or for applying a force symmetrically around the optical axis (in focus adjustment mode).

By 'stiffener' may be understood an element increasing rigidity of the lens cover and stiffener assembly relative to the lens cover (at least at the portion where it is attached), such as wherein the stiffener element has a higher rigidity than the lens cover (such as wherein rigidity may be defined as thickness along optical axis multiplied with Young's modulus in a direction along the optical axis). The stiffener element may have a rigidity which is sufficiently high, that it is substantially undeformed, such as undeformed by the actuation system upon actuation. The stiffener may be a stiffener-ring enclosing, such as completely enclosing, the optical axis.

By 'its circumferential section' may be understood an area on the lens cover being radially displaced with respect to the optical axis, such as being more than 50% of a distance from the optical axis to the edge of of the lens cover away from the optical axis.

In a first alternative aspect, the invention provides an optical lens assembly comprising:
 a frame, a bendable transparent lens cover and a transparent back window connected to the frame, wherein the lens cover and/or the back window has a non-zero Sag;
 a transparent, deformable, non-fluid lens body sandwiched between the lens cover and the back window to form a lens having an optical axis and a first optical power;
 an actuator system for applying force to the lens cover to change an overall shape of the lens, the actuator system comprising at least three individually addressable actuators each being connected to the frame and adapted to apply force to the lens cover in a direction at least substantially along the optical axis;
 wherein the actuator system has a focus adjustment mode (hereafter also just 'focus mode') where all actuators are addressed to apply force to the lens cover in the same direction to adjust the optical power/Sag of the lens; and
 wherein the actuator system has an optical image stabilisation mode where actuators are addressed to apply different forces to the lens cover in a manner that varies along the rim of the lens cover to tilt the optical axis of the lens.

It is noted that aspects and embodiments may be combined with alternative aspects and embodiments.

In a second aspect, the invention provides an objective lens module comprising the lens assembly according to the first aspect.

In a third aspect, the invention provides a camera comprising the lens assembly according to the first aspect and 3-axis motion sensors connected to provide signals indicative of movement of the camera to the actuator system. In the following, a number of preferred and/or optional features, elements, examples and implementations will be summarized. Features or elements described in relation to one embodiment or aspect may be combined with or applied to the other embodiments or aspects where applicable. In addition, explanations of underlying mechanisms of the invention as realized by the inventors are presented for explanatory purposes, and should not be used in ex post facto analysis for deducing the invention.

In a fourth aspect, the invention provides an optical device, e.g. a camera, a microscope, binoculars or a telescope, a pair of glasses or goggles, a wearable display, etc., comprising the lens assembly according to the first aspect. The lens assembly may be an additional component in the optical device, included in the design of an optical lens stack or have a lens module comprising the lens assembly.

In an embodiment there is presented an optical device comprising the lens assembly according to the first aspect wherein the optical device is any one of a camera, a microscope, binoculars or a telescope, a pair of glasses or goggles, a wearable display, a compact camera.

In a fifth aspect, the invention provides a method for producing a lens assembly according to the first aspect, said method comprising:
 providing a frame,
 providing at least one actuator, such as at least three individually addressable actuators,
 connecting the at least one actuator to the frame.

It may be understood, that by providing at least one actuator and connecting the at least one actuator to the frame, then the actuator is an actuator, such as an operable actuator, before connecting the actuator to the frame. This may be considered different with respect to providing a frame and then depositing material on the frame, which eventually becomes an actuator, but which at no point is an actuator, which is not connected to the frame. An advantage of the fifth aspect may be, that it enables producing (singulated) actuators separately. An advantage of this may in turn be, that these (singulated) actuators produced separately can be produced effectively, such as in high numbers per wafer (high density). Another possible advantage may be that other parts of the lens assembly are not exposed to the production conditions for producing the actuators. For example, it may be necessary to go to high temperatures during production of the actuators, and this may render it impossible to include certain materials in the lens assembly if the actuators are to be produced on the frame, for example plastics, but by adding the (finished, singulated) actuators, it may be possible to use these materials.

According to an embodiment, there is presented a method, wherein:
 providing at least one actuator, such as at least three individually addressable actuators, comprises providing the at least one actuator separate from the frame.

In a sixth aspect, the invention provides use of a lens assembly according to the first aspect for one or more of:
 adjusting focus, such as for adjusting focus of any one of a camera, a microscope, binoculars or a telescope, a pair of glasses or goggles, a wearable display, a compact camera,
 tilting an optical axis and optionally carry out optical image stabilization, such as tilting an optical axis and carry out optical image stabilization of any one of any one of a camera, a microscope, binoculars or a telescope, a pair of glasses or goggles, a wearable display, a compact camera.

The Sag is illustrated in FIG. 1 and is defined as the height of the lens surface from its chord given by:

$$Sag = R - \sqrt{R^2 - \left(\frac{D}{2}\right)^2} \tag{1}$$

Where R is the radius of curvature (of the central section of the lens cover) and D is the chord length equal to the diameter of the aperture. A given Sag is not limited to specific values of aperture diameter or curvature radius and thus accommodates for lenses of different sizes and strengths. In further embodiments, it is preferred that the inherent, non-zero Sag of the lens cover and/or back window is at least 10 μm, such as 15 μm or at least 20 μm.

The Sag is related to the optical power (OP) by $$OP = 8 \cdot Sag \cdot \frac{n-1}{D^2} \tag{2}$$

where n is the refractive index of the lens body. In preferred embodiments, the first optical power is at least 5 diopters such as at least 10 diopters such as at least 20 diopters.

The inherent Sag or optical power of the lens is advantageous since most prior art small adjustable lenses have zero or insubstantial inherent optical power, thus offering a total optical power at maximum voltage of maybe a few diopters. Hence, such lenses must typically be combined with a standard lens having the optical power around which adjustment is desired. Such lenses use a deformable lens cover which is flat or almost flat at zero Volt.

In an embodiment the inherent optical power of the lens assembly is non-zero, such as at least 0.1 diopters, such as at least 1 diopters, such as at least 2 diopters, such as at least 5 diopters, such as at least 10 diopters, such as at least 100 diopters. In an embodiment the lens cover and/or the back window has substantially no, such as no, optical power, such as less than 1 diopter, such as less than 0.1 diopter, such as 0 diopters (such as wherein the optical power, such as substantial optical power, is given by the shaping of the refractive lens body by the lens cover and/or back window). In an embodiment the lens cover has a non-zero Sag.

In the focus adjustment mode, the focus point of the lens is moved along the optical axis by adjusting Sag, optical power, or focal length—these being different ways to characterize the change. Such focus adjustment is often used in autofocus (AF) systems where the focus is adjusted in response to a measurement of focus in the image.

In a preferred embodiment, the actuator system in the focus mode can change the overall shape of the lens from a first overall shape where the lens has a first optical power to a second overall shape where the lens has a second optical power, and where a difference between the first and the second optical power, an optical power range, is at least 2 diopters.

In the image stabilisation mode, the optical axis of the lens is tilted. When the lens assembly is comprised in an objective lens module, the result of this tilting is essentially (for small angles) a small transverse displacement of an image formed on an image sensor. By, such as in the camera of the third aspect, providing signals indicative of movement of the camera, this transverse displacement can be used to counteract small movements of the camera and thus stabilize the image. Therefore, in a preferred embodiment, the actuator system in the OIS (Optical Image Stabiliser) mode addresses the actuators in response to signals from motion sensors indicative of movement of the frame. Preferably, the actuator system can tilt the optical axis of the lens at least +/−0.5° in at frequency of at least 20 Hz.

Since the same at least three actuators will be used for both focus adjustment and image stabilisation, the invention provides the advantage that fewer actuators are needed as compared to prior art solutions where these functions are provided by separate sets of actuators. Similarly, since the same membrane cover will be used for both focus adjustment and image stabilisation, the invention is advantageous over prior art solutions using separate surfaces/components for providing these functions. Overall, this leads to lower price and complexity (fewer moving parts), and smaller size.

In an embodiment, the lens cover and/or the back window has a non-zero Sag.

In an embodiment, the actuator system comprising at least three individually addressable actuators (7, 8).

In an embodiment, the actuator system (7, 8) has a focus adjustment mode where all actuators are addressed to apply force to the lens cover (4) in the same direction to adjust the optical power/Sag of the lens; and wherein the actuator system (7, 8) has an optical image stabilisation mode where actuators are addressed to apply different forces to the lens cover (4) in a manner that varies along the rim of the lens cover to tilt the optical axis (5) of the lens.

In an embodiment, the lens cover and/or the back window has a non-zero Sag, the actuator system comprising at least three individually addressable actuators (7, 8), and the actuator system (7, 8) has a focus adjustment mode where all actuators are addressed to apply force to the lens cover (4) in the same direction to adjust the optical power/Sag of the lens; and the actuator system (7, 8) has an optical image stabilisation mode where actuators are addressed to apply different forces to the lens cover (4) in a manner that varies along the rim of the lens cover to tilt the optical axis (5) of the lens.

In a preferred embodiment, the actuator system can be operated in the focus mode and the OIS mode simultaneously by addressing each actuator to apply a force being at least substantially a sum of the forces that would be applied in these modes. Since the lens cover deformation may not be a linear function of actuator stroke, the change in shape induced by simply adding the forces that would have be applied in each mode might not lead to exactly the combined effect of the modes. This will be discussed in more detail later.

In a preferred embodiment, the actuators can apply forces in a first direction at least substantially along the optical axis and towards the back window (pulling) and/or in a second direction at least substantially along the optical axis and away from the back window (pushing), relative to a 'relaxed' or '0 Volt' position of the lens cover. The preferred implementation depends on the type of actuator and the characteristics of the lens body and the lens cover. In a preferred embodiment, the actuators can at least pull the lens cover towards the back window to change its shape and compress the lens body. This is advantageous since it, unlike pushing, does not require the lens cover to be fixed to the lens body. In another preferred embodiment, the actuators can only apply a force in the first direction, relative to a 'relaxed' or '0 Volt' position of the lens cover. Such actuators may provide the advantage of being simpler and cheaper. Actuators that can both pull and push may be preferred as they provide the advantage of a larger overall stroke and thus a more efficient deformation of the lens cover.

Different parts of the lens cover are defined: a central section, a circumferential section, and a rim; where the central section has an at least substantially spherical shape and the circumferential section is the part between the central section and the rim of the lens cover.

The lens cover may be flat or may be pre-shaped to have a non-zero Sag. The lens is bendable, meaning that it has some flexibility to change it shape due to the forces from the actuators and the reaction force from the lens body. It is, however, stiffer than the lens body. In the embodiment of a pre-shaped lens cover, "pre-shaped" means that the lens cover has obtained its shape prior to assembling in the lens-assembly. When assembled with the lens body and the back window, such pre-shaped lens cover will preferably have a bell-shape (convex or concave) with a central section having a spherical or at least substantially spherical shape but could be also aspherical shape, corresponding to the shape of an ordinary lens surface. This is illustrated in FIGS. 2, 3A and 6. The non-zero Sag resulting from the pre-shaping of the lens cover is to be measured when the actuator system is not activated, i.e. the "default", "inherent" or "zero Volt" state of the lens.

Typical lens cover materials may be glass or plastics. For glass, the cover lens is preferably a membrane with a thickness of 5-50 μm—such glass membranes are both flexible and robust. For plastics, preferably plastics with good optical properties (even and high transparency for all visible wavelengths), the cover lens preferably has a thickness of 20-500 μm.

In a preferred embodiment, the lens cover comprises one or more stiffeners on its circumferential section serving to distribute strain and non-symmetrical deformations around optical axis resulting from the applied forces over larger areas of the membrane. When operations with no intended aberrations are to be performed, the one or more stiffeners is preferably a ring circumventing the entire central section. This is advantageous since it ensures that the circumferential section moves as one part even with a minimum number of actuators and since local deformations are avoided. One role of the one or more stiffeners may be, in the OIS mode where the lens cover is tilted, to make it possible to squeeze one side of the lens body without introducing optical power variation. In the alternative, when when one deliberately wants to create higher order astigmatism, a multitude of arc-shaped stiffeners may be positioned along the circumferential section, at positions to be engaged by the actuators when applying force.

According to an embodiment the actuator system is arranged for displacing at least a part of, such as all of, the edge (such as the rim) of the lens cover with respect to the frame. A possible advantage of this is that it dispenses with the need of some or all of the deformation of the lens cover, which is necessary if the edge (such as the rim) of the lens cover is fixed to the frame. For example, tilting of the lens cover would necessitate deformation of the lens cover if the edge of the lens cover is fixed to the frame, but when the actuators are arranged displacing the edge of the lens cover relative to the frame (such as wherein the edge of the lens cover is not fixed to the frame), this deformation is not necessary (which may lead to a more energy-efficient operation and/or allow a greater range of tilting and/or focusing).

According to an embodiment the lens cover comprises one or more stiffeners, such as ring-shaped stiffeners on its circumferential section, and wherein the at least three individually addressable actuators each being connected to the frame is each connected to the one or more stiffeners. A possible advantage of this may that the actuators can apply forces on the lens cover via the one or more stiffeners by pushing/pulling off the frame.

According to an embodiment the lens cover is connected to the frame via, such as exclusively via, the actuator system. An advantage of this may be that it facilitates that the actuators can control the position and orientation of the lens cover.

According to an embodiment the lens cover comprises one or more stiffeners, such as ring-shaped stiffeners on its circumferential section, and wherein the lens cover is connected to the frame via, such as exclusively via, the actuator system and the one or more stiffeners. An advantage of this may be that it facilitates that the actuators can control the position and orientation of the lens cover and that the actuators can apply forces on the lens cover via the one or more stiffeners by pushing/pulling off the frame.

For some types of cameras, there is a desire to make the camera smaller, and it will be advantageous to pack all the elements of the lens assembly tightly together to reduce the overall size of the lens assembly. Thus, in another preferred embodiment, the actuators are placed next to the lens body, between the circumferential section of the lens cover and the back window or back part of the frame. The feature that the actuators only exert forces in the first and second directions, and not in directions transverse to the optical axis, makes them especially suitable for being positioned like this.

In an embodiment the one or more, such as the at least three, individually addressable actuators are placed between, such as partially or fully between, the lens cover or a plane of the (rim of the) lens cover, such as between the circumferential section of the lens cover (4), and the back window or back part of the frame.

In a preferred embodiment, the one or more actuators, such as the actuators each involve a cantilever with a first end connected to the frame and a second end adapted to engage the circumferential section of the lens cover to apply the force. It is preferred that the cantilever extends in a direction tangential to the engagement point of the circumferential section. This is advantageous since it allows the actuator to be packed tightly around or below the lens cover. By bending or pivoting the cantilever, the circumferential section can be pushed up or down. Using such cantilevers are advantageous since larger stroke lengths may be obtained. In a preferred embodiment, the cantilevers comprise a layer of piezoelectric material and the addressing of an actuator involves applying a voltage over the piezoelectric material.

According to an embodiment, a line drawn from a point of connection of the cantilever to the frame, and to a point of connection of the cantilever to the lens cover (such as via a stiffener, such as a stiffener ring)

is non-parallel, such as exhibiting a smallest angle of at least 1°, such as at least 5°, such as within 5°-175°, such as within 10°-170°, such as within 20°-160°, such as within 30°-150°, such as within 45°-135°, such as within 60°-120°, such as within 75°-105°, such as 90°, with respect to a line drawn from the point of connection of the cantilever to the frame, and to the optical axis.

This is advantageous since it allows the actuator to be packed tightly around or below the lens cover, such as being packed tightly around or below the lens cover where the sum (such as the sum being of each scalar length, not the vectorial sum) of a first distance (from the optical axis to the point of connection of the cantilever to the lens cover (such as via a stiffener, such as a stiffener ring)) and a second distance (from the point of connection of the cantilever to the lens cover (such as via a stiffener, such as a stiffener ring) to the point of connection of the cantilever to the frame) is larger than, such as larger than 101% of, such as larger than 105% of, such as larger than 110% of, such as larger than 125% of, such as larger than 142% of, such as larger than 150% of, such as larger than 200% of, a third distance (from the optical axis to to the point of connection of the cantilever to the frame, such as the third distance corresponding to the vectorial sum of the vectors corresponding to vectors connecting, respectively, the end-points defining the first distance and the second distance). This may enable a relatively large stroke for a compact design. In case a "point of connection" (such as a point of connection of the cantilever to the frame or a point of connection of the cantilever to the lens cover or stiffener ring) extends spatially beyond (mathematically, infinitely small) point, such as if the point of connection is in reality a planar area or even a non-planar area, then said "point of connection" is to be understood as the centroid or geometrical mean of such area.

According to an embodiment, at least one, such as all, of the one or more, such as the at least three, individually addressable actuators (7, 8) forms an assembly with the frame, such as is bonded or glued or welded or screwed or bolted or riveted to the frame.

By "forms an assembly" is to be understood, that two separate units, such as two functioning separate units (such as a cantilever and a frame) are joined together. Bonding may for example be any one of direct bonding, anodic bonding or adhesive bonding.

According to an embodiment the lens assembly (1) comprises plastic. According to an embodiment, the lens cover (4) and/or the back window (3) comprises plastic, such as polymers, such as organic polymers.

According to an embodiment, at least one, such as all, of the one or more, such as the at least three, individually addressable actuators (7, 8) has a rectangular shape as observed in a direction along the optical axis. This may be advantageous since this is an effective way to create an actuator, since it gives max density per wafers.

Another type of actuators may preferably each involve a coil and a magnet, and the addressing of an actuator involves drawing a current through the coil.

The deformable, non-fluid lens body is preferably made from an elastic material. Since the lens body is non-fluid, no tight enclosure is needed to hold the lens body, and there are no risk of leakage. In a preferred embodiment, the lens body is made from a soft polymer, which may include a number of different materials, such as silicone, polymer gels, a polymer network of cross-linked or partly cross-linked polymers, and a miscible oil or combination of oils. Using a soft polymer makes it possible to produce lenses where the polymer is in contact with air, thus requiring much less force when adjusting the focal length of the lens. It also eases the production, as the polymer will keep in place even if the different production steps are localized in different positions or facilities. As mentioned above it also makes it possible to provide leakage channels or bubbles of compressible gas in order to reduce the required force necessary to adjust the lens and to reduce the strains caused by temperature and pressure fluctuations in the environment.

To keep the lens body in place, and to focus its deformation to the regions just under the lens cover, the lens assembly preferably further comprises structural elements adapted to restrain the change of shape of a part of the lens body opposite the lens cover. These structural elements are preferably located on the back window and in contact with the lens body.

In order to create a better transfer from force applied into a lens cover deformation and to minimise astigmatism while actuating, it is desirable to always keep the lens cover centred on the optical axis, even during tilting in the OIS mode. For these reasons, in a preferred embodiment, the lens assembly may comprise a, central member positioned within or adjacent to the lens body and on the optical axis, the central member causing the lens body to provide a radial variation in reaction forces from the lens body when the lens cover is actuated in the second direction, the reaction forces decreasing with increasing radius. This radial variation may be a result of:

a variation in the stiffness of the lens body, in which case the central member may be part of the lens body having a different material parameter (e.g. Young's modulus);
  a object different from and stiffer than the lens body positioned within the lens body and centred on the optical axis.
  a radial variation in the thickness of the lens body caused by a central member being stiffer than the lens body and positioned below the lens body to impress a centre-symmetric concave shape in the end of the lens body facing the back window.

The effect of all these implementations is that the central part of the lens body will feel stiffer when pushed at from above, and this stiffer 'core' of the lens body is a pivot point and support for the central region of the lens cover. The stiffer 'core' also means that, in the focus mode when the actuators pull the lens cover down, the radially varying reaction forces from the lens body changes the Sag of the lens cover (and thus the optical power) instead of just vertically compressing the lens body with no change in Sag. Further, it may help transfer forces between different parts of the lens cover and lens body in the OIS mode. Several different embodiments of the central member will be described later in relation to the figures. In embodiments, the central member may extend some or all the way in a direction along the optical axis from the back window to the lens cover, such as extend at least 50%, such as at least 75%, such as at least 90%, such as 100%, of this distance.

The lens cover is attached to the lens body. To ensure that the lens cover, and potentially the lens body, does not dislocate and/or break when experiencing large accelerations, the lens assembly preferably further comprises mechanical stops limiting the motion of the lens cover in at least the first and second directions, and preferably also in a plane normal thereto. This has the advantage of improving the drop test performance of the lens assembly.

The mechanical stops may be formed by parts of the frame and may work through the actuators. In the embodiment where the lens cover involves one or more stiffeners, the one or more stiffeners are preferably positioned to engage the mechanical stops.

In a preferred embodiment, the surface of the back window opposite the lens body has a non-zero Sag (piano concave-convex or bi concave/convex lens shape) to provide the inherent optical power of the lens. The back window is preferably of high optical quality and preferably made from glass or regular optical plastic like polycarbonate. The back window preferably has a refractive index close to that of the lens body, since this removes the need to include an anti-reflective coating between the back window and the lens body.

The frame is preferably the supporting structure of the lens assembly, and connects the lens assembly to the remainder of the objective lens module or the camera. The frame may be a monolithic structure or an assembly of different parts. The back window is typically formed in a different material composition than the frame. The back window may also provide some functions of the frame and effectively be part of the frame i.e. the back window may also serve as a base to anchor the actuators and a mechanical interface to the remainder of the lens module or the camera.

The back window may form the cover glass for a device involving the lens assembly, such as a mobile phone camera. This will reduce the number of layers and improve the optical quality by reducing flare and improving transmittance. The back window may have an anti-reflect coating (ARC) and also provide an IR filter function, possibly combined with filtering properties of the lens body. In another embodiment, the back window forms part of a transparent substrate of a touch screen. Such touch screens are standard in many electronic devices, such as a mobile phones, tablets, computer monitors, GPSs, media players, watches, etc. Such a touch sensitive screen may be based on different touch screen technologies such as resistive systems, capacitive systems, Surface acoustic wave systems, infrared systems, etc., all of which involves a transparent substrate at its base.

In an embodiment there is presented a mobile phone camera comprising a lens assembly according to the first aspect, wherein the back window is used as a cover glass of the mobile phone camera.

According to an aspect, there is presented use of a lens assembly according to the first aspect as part of a mobile phone, wherein the back window is used as a cover glass of the mobile phone camera.

In an alternative embodiment, an extra polymer layer is added between the back window and a cover glass on the side of the back window opposite the lens body. This provides the advantage of being more compact and better in terms of transmittance and ghost than prior art solutions, since it involves less air/glass interface. It also eliminates the need of AR coating on the back window.

In a preferred embodiment, the lens assembly involves an optical aperture in the form of a first optical stop adjacent to the lens cover and a second optical stop adjacent to the back window, wherein the first and second optical stops are non-transparent and define circumferences of openings (typically circular, but could be other shapes), which circumferences are normal to and concentric with the optical axis and define an optical aperture of the lens assembly. The optical aperture preferably has a diameter of at least 1 mm, such as at least 2 mm or at least 3 mm or even at least 4 mm. The second optical stop may be a non-transparent material layer formed on either side of the back window, e.g. by printing.

In an embodiment there is presented a lens assembly wherein the actuator system and the lens cover are arranged so that in the focus adjustment mode the actuator system upon actuation indirectly deforms the lens cover. By 'indirectly' may be understood, that the actuator system is arranged with respect to the lens cover, so that the deformation of the lens cover (in the focus adjustment mode) is dependent on a third element, such as the lens body and/or the central member.

The first, second, third, fourth, fifth and sixth aspect of the present invention may each be combined with any of the other aspects. These and other aspects of the invention will be apparent from and elucidated with reference to the embodiments described hereinafter.

BRIEF DESCRIPTION OF THE FIGURES

The lens assembly according to the invention will now be described in more detail with regard to the accompanying figures. The figures show one way of implementing the present invention and is not to be construed as being limiting to other possible embodiments falling within the scope of the attached claim set.

DETAILED DESCRIPTION OF THE INVENTION

Due to the large number of preferred but optional features and elements, these will be shown in and described in relation to a number of figures each displaying only some of the features and elements, with none of the figures displaying all of the possible features and elements. Which features and elements are shown and described together is not indicative of these being connected or dependent on each other when this is not explicitly implied.

Figure 1:
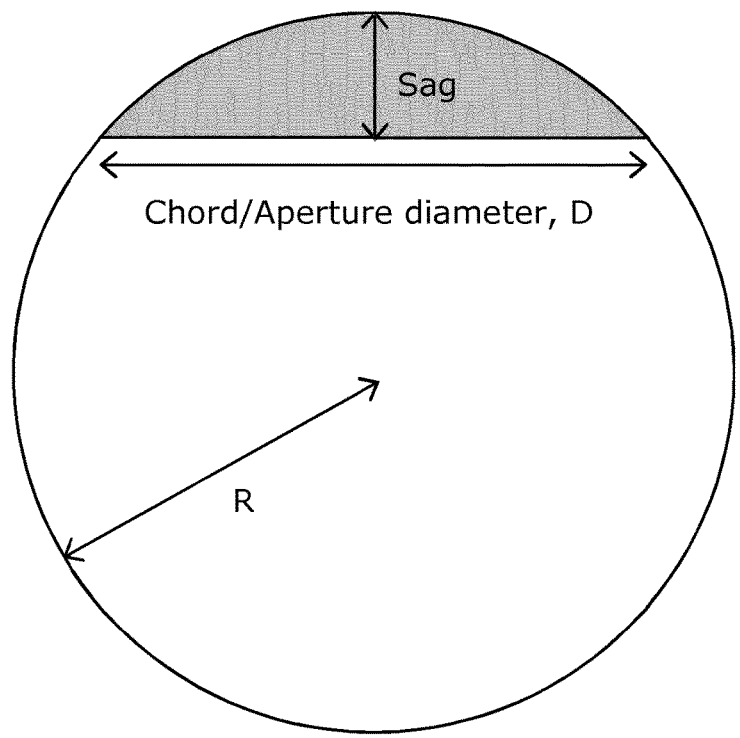
FIG. 1 illustrates various design parameters for a lens assembly according to the invention.
Figure 2:
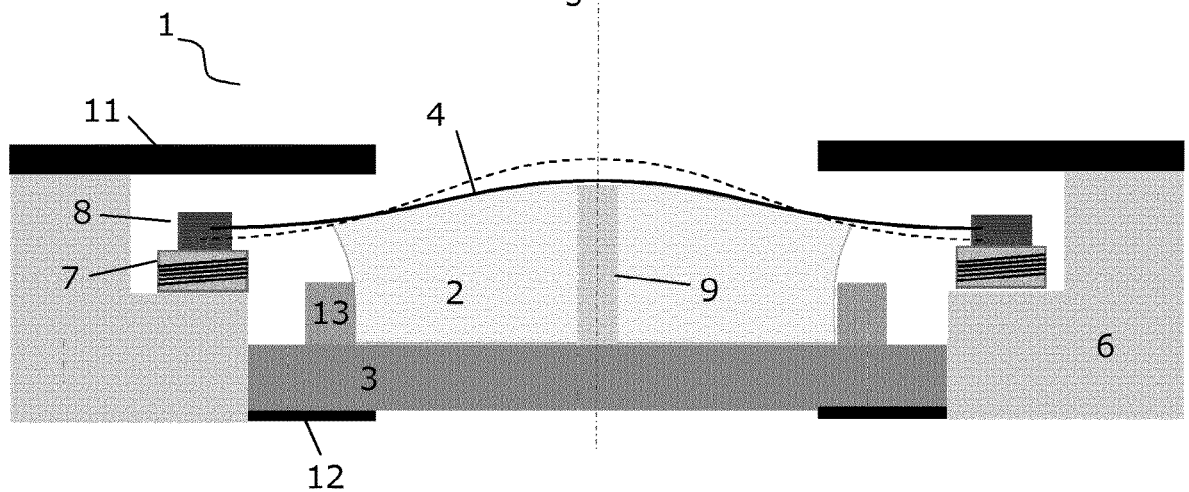
FIG. 2 illustrates a cross-sectional view of a lens assembly according to an embodiment of the invention.

In FIG. 2, a lens assembly 1 in accordance with a preferred embodiment of the invention comprises a deformable, non-fluid lens body 2 sandwiched between a back window 3 and a transparent, flexible lens cover 4 to form a lens with an optical axis 5 being normal to a surface part of the back window. The various components of the lens assembly is held together by a frame 6, which may comprise separate parts that also provide another function in the assembly. For example, the back window 3 can also act as a support for other components and will be part of the frame in this respect. Further, an actuator system 7, 8 is provided for applying a force to change the overall shape of the membrane and the lens.

In the embodiment of FIG. 2, the actuator system involves a coil 7 attached to the frame and a magnet or magnetizable member 8 attached to the lens cover and possibly extending into, but not attached to, the coil. Here, the addressing of the actuator involves drawing a current through the coil to generate a magnetic field exerting a force on the magnet. In this setup, with the magnet or member 8 being centred on the longitudinal axis of the coil and this being parallel to the optical axis, the forces exerted on the lens cover will be directed at least substantially along the optical axis.

Figure 3A:
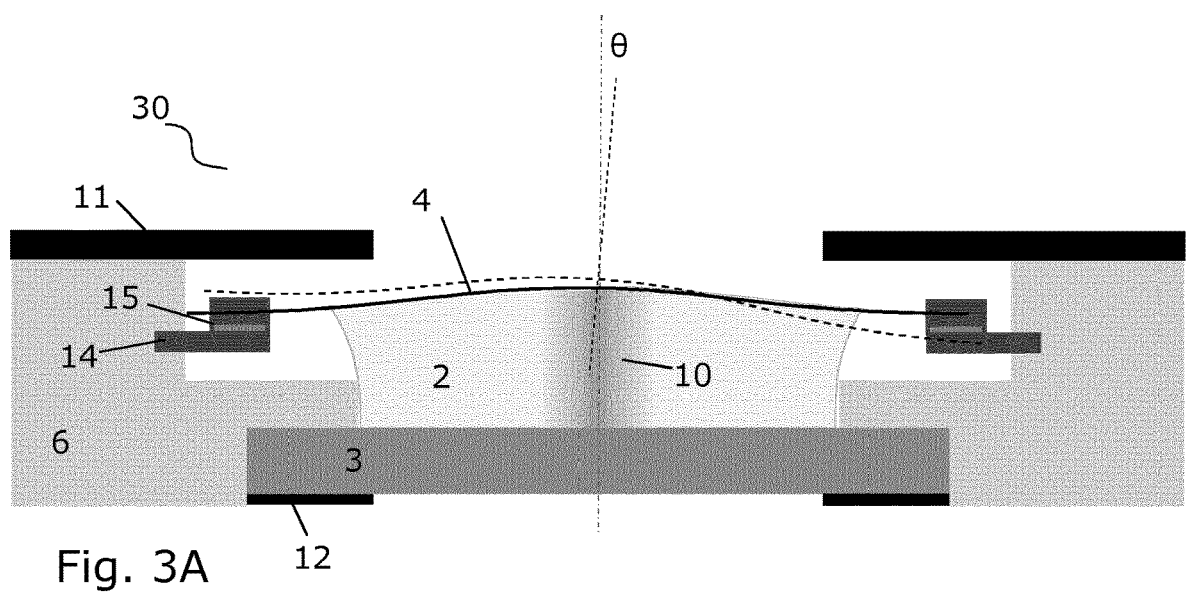
FIGS. 3A and B illustrate a cross-sectional side view and a top view of a lens assembly in accordance with an embodiment of the invention.
Figure 4A:
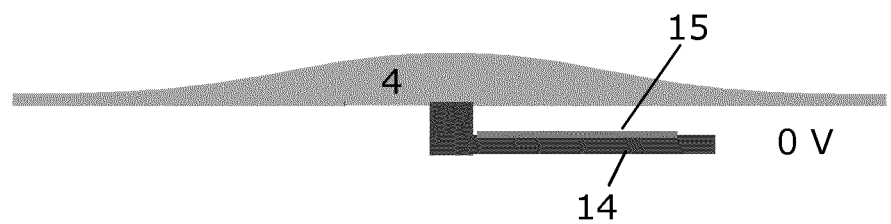
FIGS. 4A-C illustrate the movement of an actuator in the embodiment illustrated in FIGS. 3A and B.
Figure 4B:
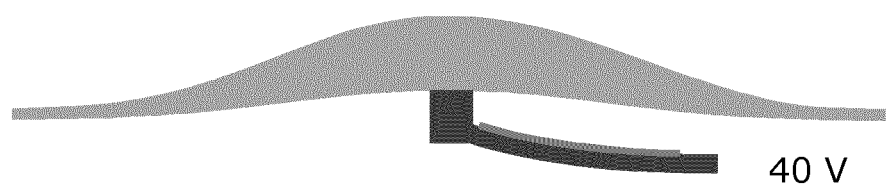
Figure 4C:
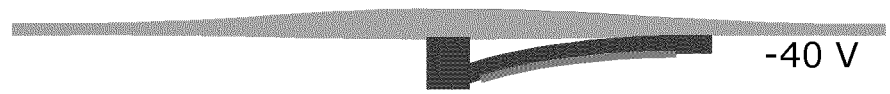

Another preferred actuator system is illustrated with the lens assembly 30 in FIGS. 3A and B. Here the actuator is provided by a cantilever 14 with opposite ends being connected to the frame 6 and the lens cover, respectively. The cantilever can be bend or pivoted so that the end connected to the cover member moves up/down relative to the frame. The cantilever can be formed in silicon and be bend by having a layer of piezoelectric material formed on one or both sides and applying a voltage over the piezoelectric material. By having the cantilever extending in a direction tangential to the point where it connects with the lens cover, the cantilever can be made relatively long without taking up additional space. The longer the actuator, the longer the stroke (the distance that the connection point to the lens cover moves) can be. The obtainable stroke not only depends on the cantilever (or piezo-actuator) length, but also on the thickness of the beam under the piezo-film. If the thickness is too large then the stroke is small since the piezo action will be too weak to bend it much. If the thickness is too small then the stroke is small too because the cantilever will not provide a rigid support for the piezo-film. FIGS. 4A-C illustrates the cantilever 14 with different voltages over the piezoelectric material 15 and the resulting bending of the cantilever and change of shape of the lens cover 4.

Having three or more such cantilevers allows for these to work in synchrony to change the shape of the lens resulting in a desired optical effect. In FIG. 2, the dotted profile above the lens cover 4 illustrates the effect of an exemplary (not to scale) movement in the FA mode, where the actuators are all addressed to exert force in the same direction to move the circumferential section upwards. The shape of the lens cover is thereby changed toward a flatter profile resulting in a longer focal length (smaller Sag and OP). Similarly, in FIG. 3A, the dashed profile above the lens cover 4 illustrates the effect of an exemplary (not to scale) movement in the OIS mode, where the actuators are addressed to apply different forces to the lens cover in the first or second direction in a manner that varies along the rim of the lens cover. The shape of the lens cover is thereby changed to tilt the optical axis an angle θ without substantial changes in focal length/Sag/OP.

Both actuators 7, 8 and 14, 15 described above can be positioned between the lens cover and the back window in order to pack the actuators as closely as possible to reduce the overall size of the lens assembly.

Figure 5:
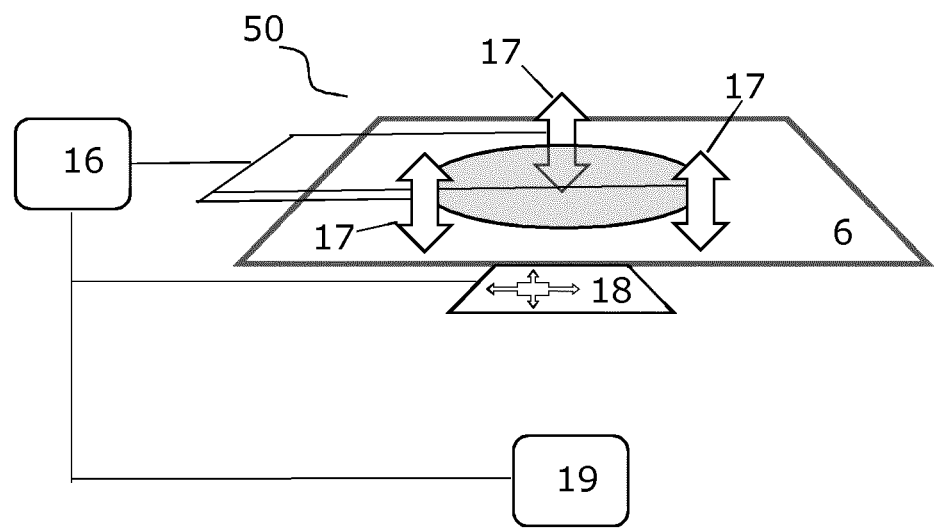
FIG. 5 is a schematic overview of the various aspects of the invention.

The actuator system can comprise an electronic processor for controlling the actuators, i.e. addressing them with the correct signals, but this can also be performed by a processor for the objective lens module or the camera. FIG. 5 illustrates an electronic processor 16 connected to actuators 17 on lens assembly 50. The processor is programmed to control the actuators in OIS and FA mode based on input from 2D or 3D motion sensor 18 connected to the frame 6 and focus detector 19 receiving light transmitted by the lens. The focus detector could be active or passive, such as a phase detection or contrast detection auto focus sensor.

As mentioned previously, the change in shape induced by adding forces that would have been applied in an OIS mode and a focus mode might not lead to exactly the combined effect of these modes. This is because the change in shape of the lens cover is typically not linearly dependent upon the stroke length of the actuator. Consider a certain stroke of an actuator pushing or pulling one part of the circumference a certain distance and resulting in a change in shape of the lens cover. This change in shape will be different if the entire circumference has already been displaced in either direction or not. Therefore, simply adding the forces that would have been applied in OIS and Focus modes would not necessarily lead to the combined effect of these forces individually. The way actuators are addressed in the different modes could be a result of a calibration routine where a well-defined object is imaged using the objective lens module and the actuators are driven until certain lateral image displacements and image focusing/de-focusing patterns are achieved. By recording the values that the actuators are addressed with during the routine, the values to be used for any desired displacement or focus can be calculated by inter- and extrapolation. Alternatively, the non-linear behaviour of lens cover deformations as a function of actuator stroke may be known, whereby an algorithm for adding forces for actuators can be applied.

The lens cover may be pre-shaped to impress an overall shape to the lens where it has non-zero Sag. Here, a central section of the pre-shaped membrane has a substantially spherical shape to function as a lens surface, but may have small differences to correct for various optical aberrations. The pre-shaped form of the membrane can be a bell-shape (FIG. 2, 3A, 6), a spherical shape (not shown), or others. In the case of a bell-shaped membrane, the central section can be defined as lying within the inflection points in the curve, as the areas outside will have a concave shape and thus not contribute to the focusing.

The lens body can have a shape corresponding to the shape of the pre-shaped membrane so that abutting these will not change the shape of the membrane. This can be done by pre-shaping the lens body prior to assembly or by injecting a mouldable material in between the back window and the membrane. In a specific embodiment, a liquid reaction mixture is injected between the back window and the membrane. Then the lens is put into a furnace at high temperature for a specific time and the liquid reaction mixture turns to viscoelastic non-fluid polymer shaped to the shaped, such as shaped to the shape, of the pre-shaped membrane.

The lens body is non-fluid, and thus preferably has an elastic modulus larger than 300 Pa, thereby avoiding deformation due to gravitational forces in normal operation. The lens body can be formed from a polymer network of cross-linked or partly cross-linked polymers and a miscible oil or combination of oils, preferably resulting in a lens body having a refractive index larger than 1.3.

As mentioned previously, a central member can induce a radial variation in the reaction forces from the lens body when the lens cover actuated, which radial variation could be a result of:

- a variation in the stiffness of the lens body, where the central member is a part of the lens body having a different material parameter (e.g. Young's modulus). This is illustrated in FIGS. 2 and 3A where the lens body has a central member 9 or 10 on and along the optical axis that is stiffer than the remainder of the lens body but with the same refractive index. This central member can serve as a pivot point and support for the lens cover when the actuators push/pull on the circumferential section thereof. The central member 9 can be a distinct section with a step in the elastic modulus to the remainder of the lens body as illustrated in FIG. 2. Alternatively, the central member 10 could be formed within the lens body to give a radial gradient in the elastic modulus as illustrated in FIG. 3A. The central members 9 and 10 could be formed by an inhomogeneous hardening of a liquid reaction mixture to form a viscoelastic non-fluid polymer with radially variation, such as radial variation and/or radially varying, in material parameters.
- an object different from and stiffer than the lens body positioned within the lens body and centred on the optical axis, this is illustrated in FIGS. 9A and B.

Figure 9A:
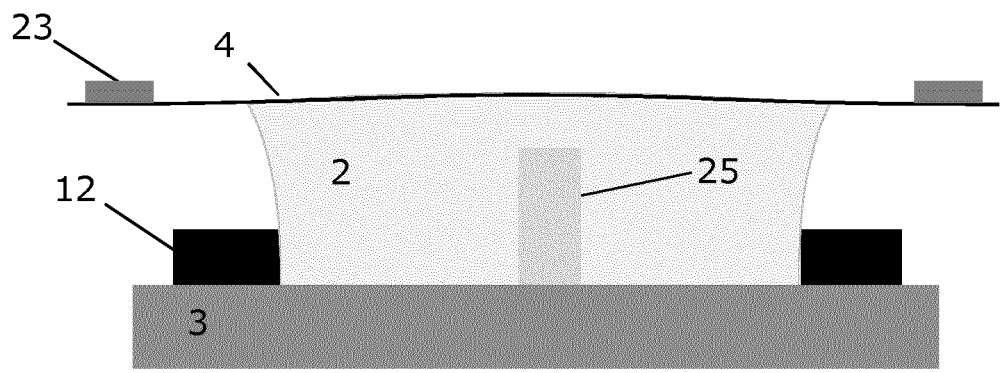
FIGS. 9A-C illustrate different embodiments of the central member.
Figure 9B:
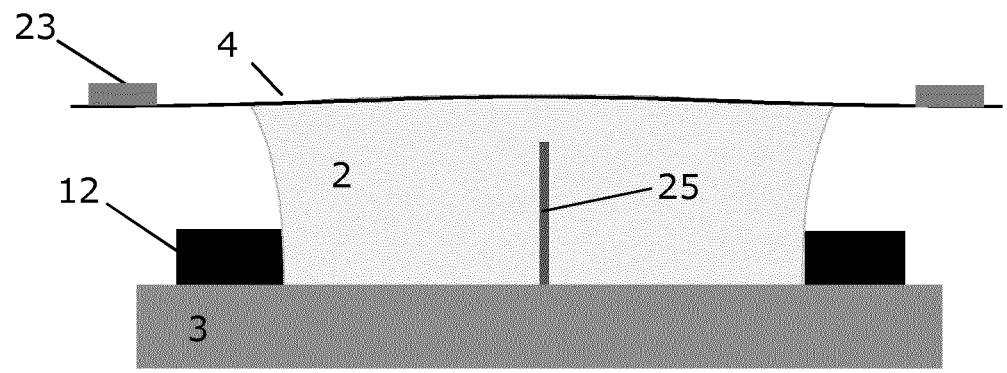
Figure 9C:
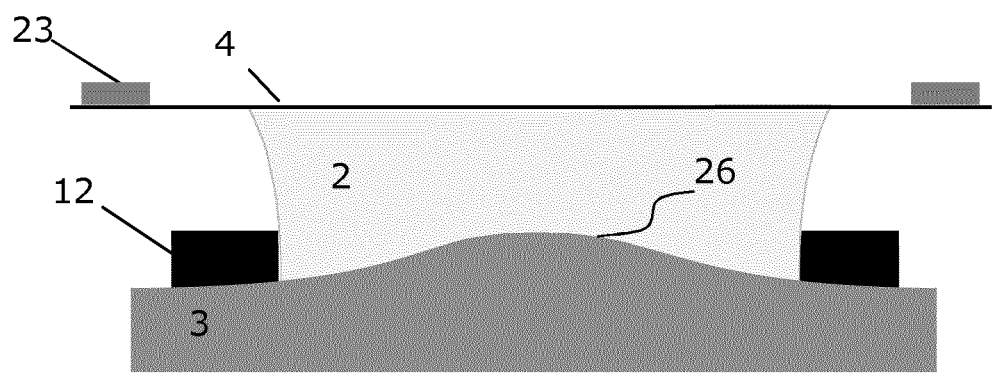
Figure 10A:
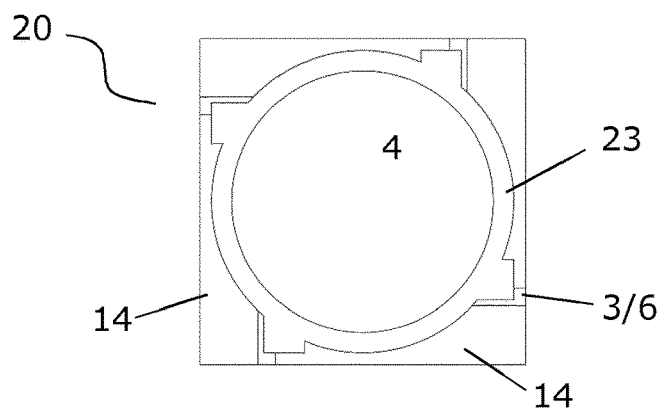
FIGS. 10A-D show different views of a lens assembly according to an embodiment of the invention.
Figure 10B:
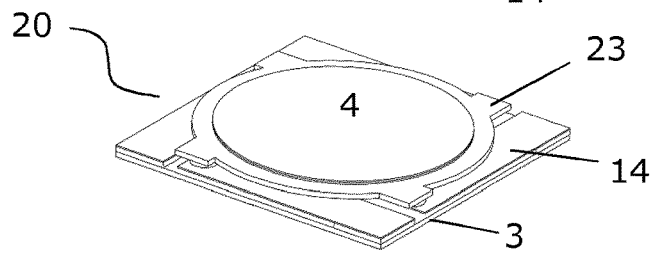
Figure 10C:
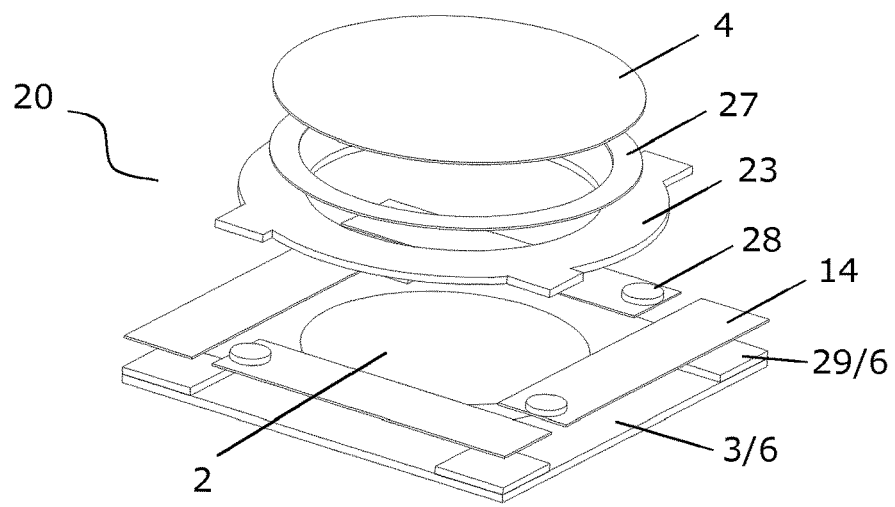
Figure 10D:
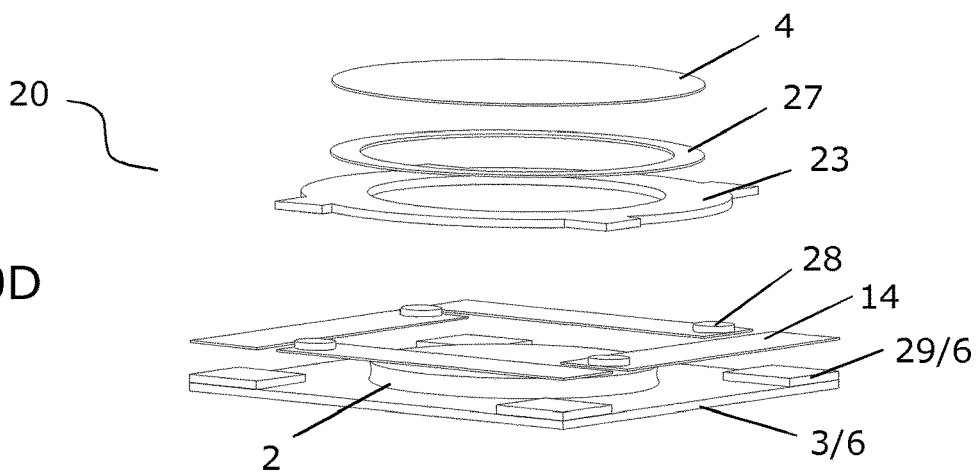

In FIG. 9A, the member is a rod or pillar of a material having a refractive index identical or close to the lens body but a higher Young's modulus. Since the lens cover should preferably be attached to the lens body, the central member can be shorter than the lens body so that it is not through-going, as is shown in FIG. 9A. In FIG. 9B, the central member 25 is a cylindrical object with radius r<<R and positioned on and along the optical axis, but not extending through the lens body to the lens cover. Due to the very small diameter, the object will hardly be visible in the formed image since the effect will be only to reduce the light collected to create the image by the ration $(r/R)^2$. Thus, the refractive index of the object is irrelevant and it need not be transparent.

a radial variation in the thickness of the lens body caused by a central member positioned to impress a centre-symmetric concave shape in the lower end of the lens body, this is illustrated in FIG. 9C. Here, the back window has a Sag towards the lens body that serves to provide an optical power, but which also serves as a central member 26 resulting in a radially varying thickness of the lens body.

As mentioned previously, the lens assembly can incorporate mechanical stops to ensure that the cover membrane, and potentially the lens body, does not dislocate and/or break when experiencing large accelerations. Different implementations of such stops are illustrated in FIGS. 6 and 7.

Figure 3B:
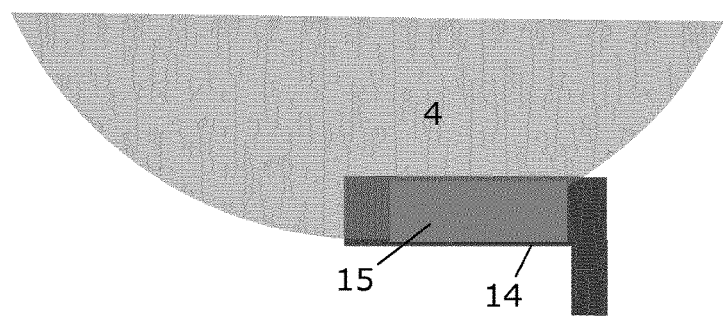
Figure 6:
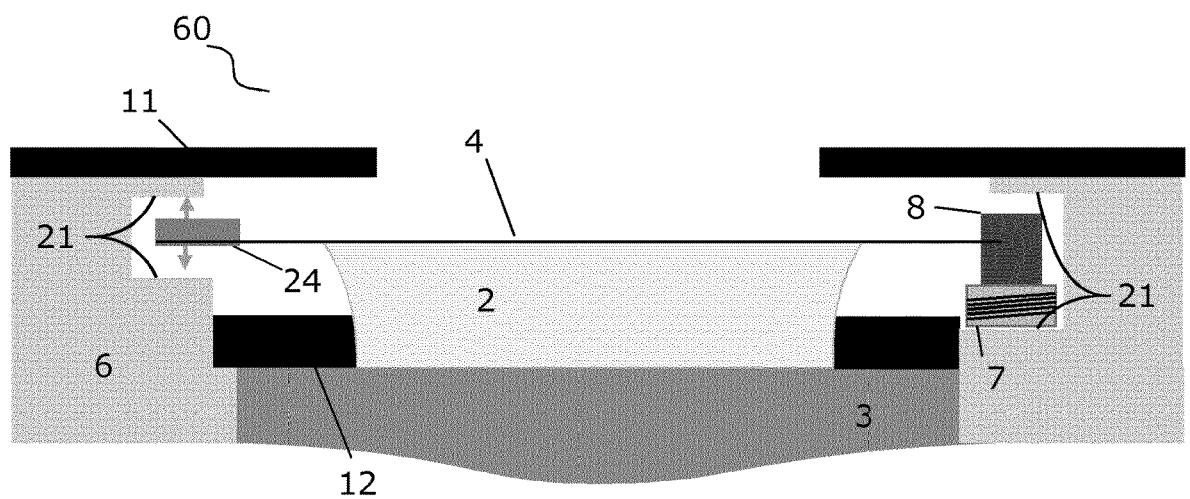
FIG. 6 illustrates a cross-sectional view of a lens assembly showing a number of preferred features and elements in accordance with embodiments of the invention.
Figure 7:
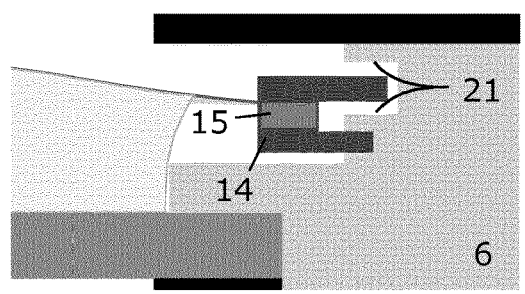
FIG. 7 illustrates how a mechanical stop may be implemented using an actuator from the embodiment illustrated in FIGS. 3A and B.

In FIG. 6, in the left side of lens assembly 60, mechanical stops 21 are formed by parts of the frame that limits the movement of the circumferential part of the lens cover in the first and second directions. Actuator is not shown here. On the right side of lens assembly 60, the actuator 7, 8 described above in relation to FIG. 2 is shown. Here the mechanical stop 21 are limiting the movement of the member 8, and thus, through its connection to the cover member, also of the cover member. FIG. 7 shows a cover member and the actuator 14, 15 described above in relation to FIG. 3. Here, the cantilever 15 has a protrusion extending into an intrusion in the frame 6, thereby providing mechanical stops 21 for the end of the cantilever connected to the lens cover.

Figure 8:
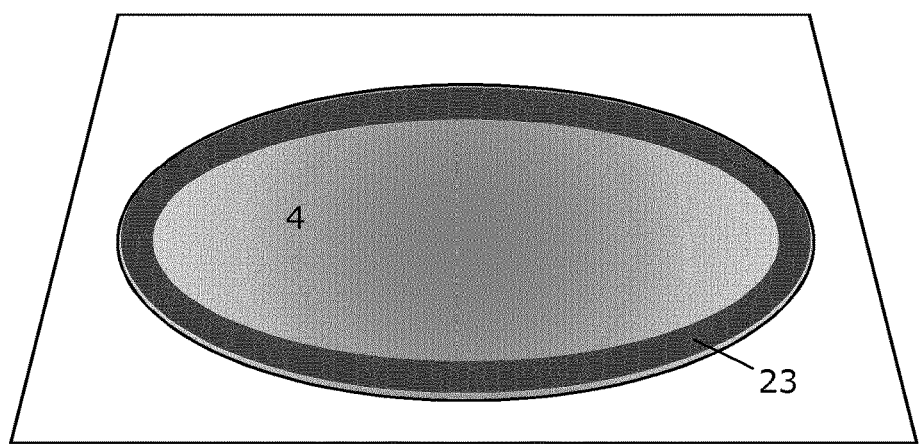
FIG. 8 illustrates a lens cover with a stiffener ring.

FIG. 6, left side, illustrate a stiffener 24 on the lens cover 4. Stiffeners can increase the strength of engaging points for mechanical stops or actuators and distribute the forces over larger areas, or they can be used to increase the rigidity of the sections between such engaging points, to ensure a more continuous change in shape. FIG. 8 illustrates the preferred embodiment of one single ring-shaped stiffener 23 on the circumferential section of the lens cover 4. The stiffeners can be made in metal or other rigid material to provide a large strength-to-weight ratio. Typical thickness' can be 50-200 µm.

In an embodiment, there is provided a lens assembly wherein the lens cover 4 comprises one or more ring-shaped stiffeners 23 on its circumferential section serving to distribute strain and non-symmetrical deformations around the optical axis resulting from the applied forces over larger areas of the lens cover 4.

Different aperture stops 11, 12 formed at different positions are illustrated in FIGS. 2, 3A, and 6 (and also in FIGS. 9A-C and 11). The aperture size will typically be in the range of 1-6 mm, and the stops can be made of any black material sheet or printed non-transparent material. The aperture stops could be back window and/or lens cover directly, typically with a thickness ranging from a few microns to a few tens of microns.

To keep the lens body in place, and to focus the change of shape to the regions just under the lens cover, the lens assembly can be partly enclosed preferably further comprises structural elements 13 (FIG. 2) adapted to restrain the change of shape of a part of the lens body opposite the lens cover. These structural elements are preferably located on the back window and in contact with the lens body, and may be provided by the aperture stop 12 as in FIG. 6 and FIGS. 9A-C.

To keep the lens body in place, and to focus the change of shape to the regions just under the lens cover, the lens assembly can be partly enclosed and preferably further comprises (enclosing, such as encircling the lens body and the optical axis) structural elements 13 (FIG. 2) adapted to restrain the change of shape of a part of the lens body opposite the lens cover. These structural elements are preferably located on the back window and in contact with the lens body, and may be provided by the aperture stop 12 as in FIG. 6 and FIGS. 9A-C.

In embodiments, the lens assembly may be arranged so that there is non-zero distance between the lens body and the frame in a direction orthogonal to the optical axis. The lens body may thus not fill the entire cavity space delimited by the frame, the back window and the lens cover. In practice, this may be advantageous for canceling thermal compensation.

The lens cover and/or the back window preferably involves one or more layers or coatings, such as:

A barrier layer to protect against moisture.

An anti reflection layer.

An IR wavelength filtering layer to create IR filtering

A possible implementation 20 of the lens assembly is illustrated in FIGS. 10A-D with the various components having a realistic relative sizes. The various views show the components discussed in the previous description and summarized here:

20: Lens assembly.

2: Lens body.

3: Back window, also part of frame 6.

4: Lens cover.

6: Frame or frame part.

14: Cantilever.

23: Stiffener ring with engagement studs for the cantilever.

27: Seal and/or fixture between stiffener ring and lens, such as lens cover (4).

28: Flexible and/or slippery cushions or hinges (such as hinges not necessarily being flexible and/or slippery) to ensure that the stiffener ring does not rotate around optical axis when cantilever is bend. It may be understood that cushions might allow detachment, such as detachment between cantilever 14 and stiffener ring 23 during normal use, whereas hinges might not allow such detachment (such as during normal use).

29: Support for cantilever, also part of frame 6.

FIG. 10 shows that the actuators (cantilevers 14) are connected to the frame 6 and each cantilever connects the frame 6 to the stiffener ring 23, and that the stiffener ring 23 connects the actuators to the lens cover 4. Thus, neither the lens cover nor the stiffener ring is fixedly connected to the frame. The lens cover and the stiffener ring are only connected to the frame via the actuators. Actuation of the actuator system may then displace the lens cover and stiffener ring, such as the edge or rim of the lens cover, with respect to the frame. The actuators exert forces on the lens cover via the stiffener ring. The stiffener ring may for practical purposes be considered rigid (such as more rigid than the lens cover), hence the actuation system does not directly deform the lens cover, the actuator system merely directly moves (up/down) the lens cover or sides of the lens cover. However, by moving (up/down) the lens cover, the lens body applies a force on the lens cover, which may deform it. The actuator system may tilt the lens cover without the tilting necessarily entails a change in optical power of the lens body. In FIG. 10 a line drawn from a point of connection of the cantilever to the frame, and to a point of connection of the cantilever to the lens cover (such as via a stiffener, such as a stiffener ring)

is non-parallel with respect to a line drawn from the point of connection of the cantilever to the frame, and to the optical axis.

When integrate in devices

Figure 11:
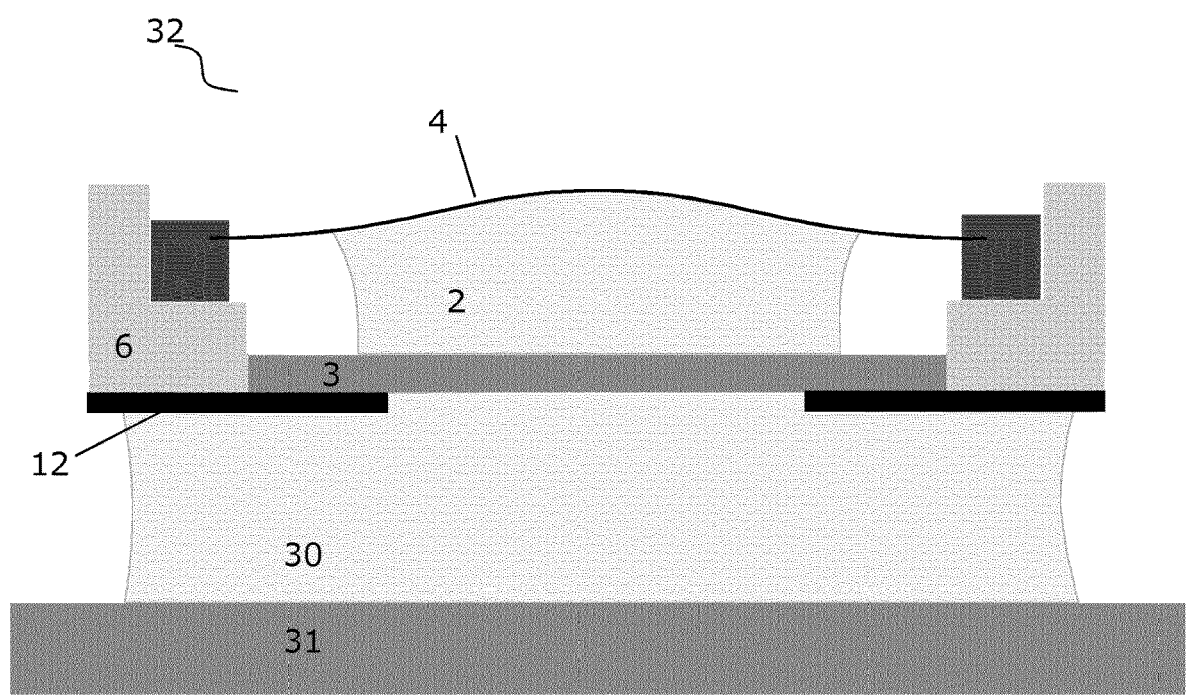
FIG. 11 illustrates a cross-sectional view of a lens assembly with an extra polymer layer and a cover glass in accordance with an embodiment of the invention.

If the lens assembly is to be integrated in a device that already has a cover glass, it may not be able to use the back window as cover glass, and a way to optically interface or integrate the lens assembly with the device is needed. FIG. 11 illustrates a lens assembly 32 with an extra polymer layer 30 and a cover glass 31. Here, the extra polymer layer 30, which is preferably passive, provides a flexible optical interface without any air/glass interfaces.

Figure 12:
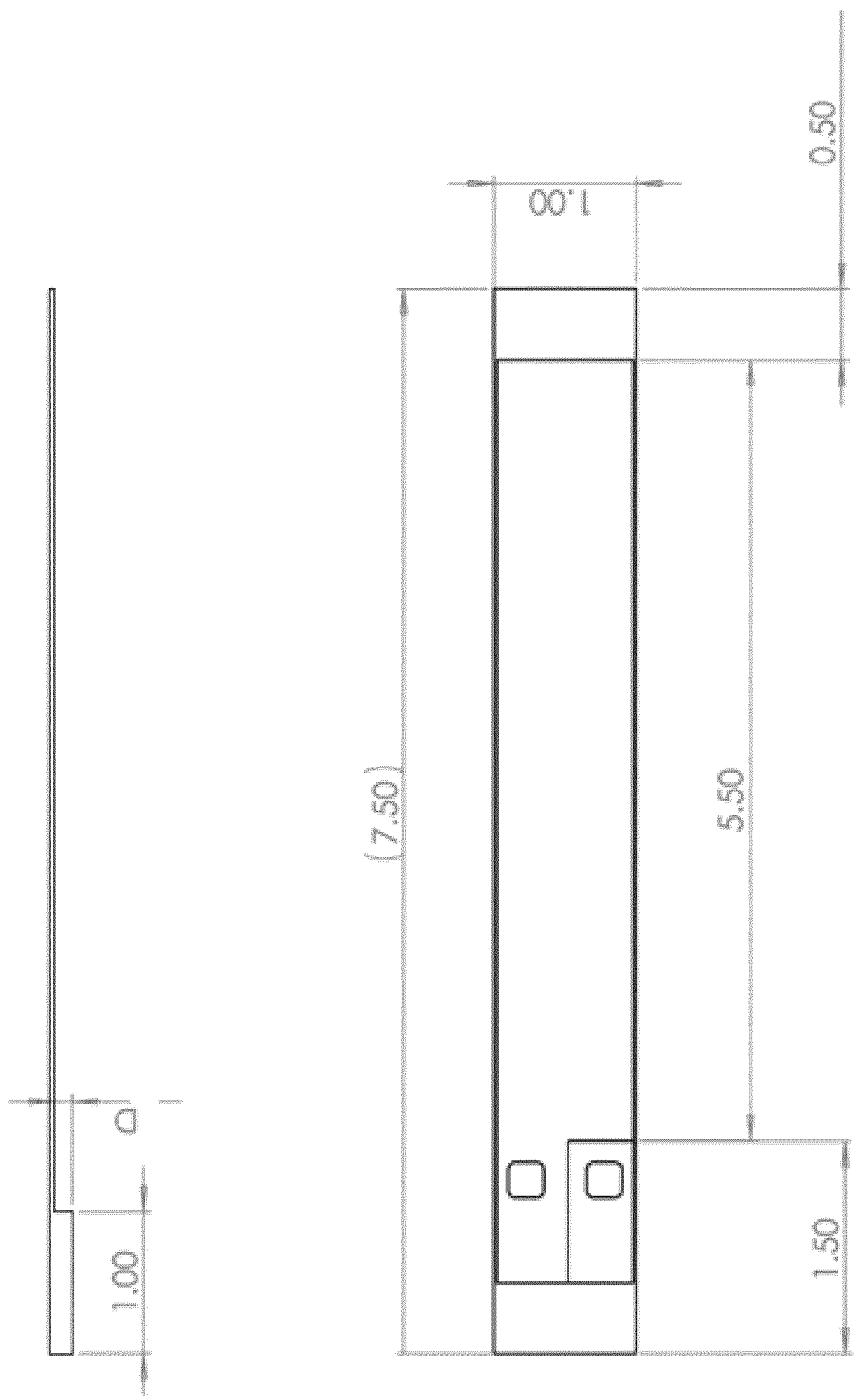
FIG. 12 shows a drawing of an actuator.

FIG. 12 shows a drawing of an actuator, such as an actuator 14 depicted in FIG. 10. The actuator is rectangular. The units are given in millimeters. Thickness 'D' may be within 1-1000 micrometers, such as 1 micrometer, such as 10 micrometers, such as 50 micrometers, such as 100 micrometers, such as 175 micrometers, such as 200 micrometers, such as 350 micrometers, such as 750 micrometers. According to an example, the thickness 'D' may be 175 micrometer, the deflection may be bi-directional deflection +/−125 µm at 50 V max, load at max deflection is within 10-40 mN, electrical contact is given by contact pads to be suitable for wire bonding, environmental protection includes a passivation layer to be added to cover all sensitive layers, breakdown voltage is 80 V.

Alternative embodiments E1-E33 are provided below:

E1. An optical lens assembly comprising:
- a frame, a bendable transparent lens cover and a transparent back window connected to the frame, wherein the lens cover and/or the back window has a non-zero Sag;
- a transparent, deformable, non-fluid lens body sandwiched between the lens cover and the back window to form a lens having an optical axis and a first optical power;
- an actuator system for applying force to the lens cover to change an overall shape of the lens, the actuator system comprising at least three individually addressable actuators each being connected to the frame and adapted to apply force to the lens cover in a direction at least substantially along the optical axis;

wherein the actuator system has a focus adjustment mode where all actuators are addressed to apply force to the lens cover in the same direction to adjust the optical power/Sag of the lens; and wherein the actuator system has an optical image stabilisation mode where actuators are addressed to apply different forces to the lens cover in a manner that varies along the rim of the lens cover to tilt the optical axis of the lens.

E2. The lens assembly according to embodiment E1, wherein the actuator system can be operated in the focus adjustment mode and the image stabilisation mode simultaneously by addressing each actuator to apply a force being at least substantially a sum of the forces that would be applied in these modes.

E3. The lens assembly according to any of the preceding embodiments, wherein the actuator system in the focus adjustment mode can change the overall shape of the lens from a first overall shape where the lens has a first optical power to a second overall shape where the lens has a second optical power, and where a difference between the first and the second optical power, an optical power range, is at least 2 diopters.

E4. The lens assembly according to any of the preceding embodiments, wherein the actuators are positioned next to the lens body, between the circumferential section of the lens cover and the back window.

E5. The lens assembly according to any of the preceding embodiments, wherein the actuators each involve a cantilever with a first end connected to the frame and a second end adapted to engage the lens cover to apply the force, and wherein each cantilever comprises a layer of piezoelectric material and the addressing of an actuator involves applying a voltage over the piezoelectric material.

E6. The lens assembly according to any of the preceding embodiments, further comprising a central member positioned within or adjacent to the lens body and on the optical axis, the central member causing the lens body to provide a radial variation in reaction forces from the lens body when the lens cover is actuated in the a direction towards the back window, the reaction forces decreasing with increasing radius.

E7. The lens assembly according to any of the preceding embodiments, further comprising mechanical stops limiting the motion of the lens cover in directions at least substantially along the optical axis.

E8. The lens assembly according to embodiment E7, wherein the mechanical stops are formed by parts of the frame and one or more stiffeners on the circumferential section of the lens cover are positioned to be engaged by the mechanical stops E9. The lens assembly according to any of the preceding embodiments, wherein the lens cover and/or the back window has a Sag of at least 10 µm, 15 µm or at least 20 µm.

E10. The lens assembly according to any of the preceding embodiments, further comprising a first optical stop adjacent to the lens cover and a second optical stop adjacent to the back window, wherein the first and second optical stops are non-transparent and define circumferences of openings, which circumferences are normal to and concentric with the optical axis and define an optical aperture of the lens assembly.

E11. The lens assembly according to any of the preceding embodiments, wherein the back window is used as a cover glass of the mobile phone camera.

E12. The lens assembly according to any of the preceding embodiments, wherein the lens cover comprises a ring-shaped stiffeners on its circumferential section serving to distribute strain and non-symmetrical deformations around optical axis resulting from the applied forces over larger areas of the membrane E13. The lens assembly (1) according to any of the preceding embodiments, wherein the lens cover (4) comprises one or more ring-shaped stiffeners (23) on its circumferential section serving to distribute strain and non-symmetrical deformations around the optical axis resulting from the applied forces over larger areas of the lens cover (4).

E14. The lens assembly (1) according to any of the preceding embodiments, wherein the actuator system (7, 8) is arranged for displacing at least a part of, such as all of, the edge of the lens cover (4) with respect to the frame (6).

E15. The lens assembly (1) according to any of the preceding embodiments, wherein the lens cover (4) comprises one or more stiffeners, such as ring-shaped stiffeners (24) on its circumferential section, and wherein the at least three individually addressable actuators (7, 8) each being connected to the frame is each connected to the one or more stiffeners.

E16. The lens assembly (1) according to any of the preceding embodiments, wherein the lens cover (4) is connected to the frame via, such as exclusively via, the actuator system (7, 8).

E17. The lens assembly (1) according to any of the preceding embodiments, wherein the lens cover (4) comprises one or more stiffeners, such as ring-shaped stiffeners (24) on its circumferential section, and wherein the lens cover (4) is connected to the frame via, such as exclusively via, the actuator system (7, 8) and the one or more stiffeners.

E18. The lens assembly (1) according to any of the preceding embodiments, wherein at least one, such as all, of the at least three individually addressable actuators (7, 8) forms an assembly with the frame, such as is bonded or glued or welded or screwed or bolted or riveted to the frame (6).

E19. The lens assembly (1) according to any of the preceding embodiments, wherein at least one, such as all, of the at least three individually addressable actuators (7, 8) has a rectangular shape as observed in a direction along the optical axis.

E20. The lens assembly (1) according to any of the preceding embodiments, wherein the lens assembly (1) comprises plastic.

E21. The lens assembly (1) according to any of the preceding embodiments, wherein the lens cover (4) and/or the back window (3) comprises plastic.

E22. The lens assembly (1) according to any of the preceding embodiments, wherein the inherent optical power of the lens assembly (1) is non-zero, such as at least 0.1 diopters, such as at least 1 diopters, such as at least 2 diopters, such as at least 5 diopters, such as at least 10 diopters, such as at least 100 diopters.

E23. The lens assembly (1) according to any of the preceding embodiments, wherein the lens cover (4) and/or the back window (3) has substantially no, such as no, optical power, such as less than 1 diopter, such as less than 0.1 diopter, such as 0 diopters.

E24. The lens assembly (1) according to any of the preceding embodiments, wherein the lens cover (4) has a non-zero Sag.

E25. The lens assembly (1) according to any of the preceding embodiments, wherein the at least three individually addressable actuators (7, 8) are placed between the lens cover (4) or a plane of the lens cover, such as between the circumferential section of the lens cover (4), and the back window (3) or back part of the frame (6).

E26. The lens assembly (1) according to any of the preceding embodiments, wherein the actuator system (7, 8) and the lens cover (4) are arranged so that in the focus adjustment mode the actuator system upon actuation indirectly deforms the lens cover (4).

E27. The lens assembly (1) according to any of the preceding embodiments, wherein a line drawn
from a point of connection of the cantilever to the frame, and
to a point of connection of the cantilever to the lens cover (such as via a stiffener, such as a stiffener ring)
is non-parallel with respect to a line drawn
from the point of connection of the cantilever to the frame, and
to the optical axis.

E28. An optical device comprising the lens assembly (1, 30, 60, 32) according to any of the preceding embodiments.

E29. An optical device comprising the lens assembly (1, 30, 60, 32) according to any of embodiments E1-E27, wherein the optical device is any one of a camera, a microscope, binoculars or a telescope, a pair of glasses or goggles, a wearable display, a compact camera.

E30. A mobile phone camera comprising a lens assembly (1) according to any one of embodiments E1-E27, wherein the back window (3) is used as a cover glass of the mobile phone camera.

E31. A method for producing a lens assembly (1) according to any one of embodiments E1-E27 comprising:
providing a frame (6),
providing at least one actuator, such as at least three individually addressable actuators (7, 8),
connecting the at least one actuator to the frame (6).

E32. A method for producing a lens assembly (1) according to embodiment E31, wherein:
providing at least one actuator, such as at least three individually addressable actuators (7, 8),
comprises providing the at least one actuator separate from the frame (6).

E33. Use of a lens assembly (1, 30, 60, 32) according to any one of embodiments E1-E27 for one or more of:
adjusting focus, such as for adjusting focus of any one of a camera, a microscope, binoculars or a telescope, a pair of glasses or goggles, a wearable display, a compact camera,
tilting an optical axis and optionally carry out optical image stabilization, such as tilting an optical axis and carry out optical image stabilization of any one of any one of a camera, a microscope, binoculars or a telescope, a pair of glasses or goggles, a wearable display, a compact camera.

For the above embodiments E1-E33, it may be understood that reference to preceding 'embodiments' may refer to preceding embodiments within embodiments E1-E33.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. An optical lens assembly comprising:
a frame, a bendable transparent lens cover and a transparent back window connected to the frame;
a transparent, deformable, non-fluid lens body sandwiched between the lens cover and the back window to form a lens having an optical axis and a first optical power;
an actuator system configured to apply force to the lens cover to change an overall shape of the lens, the actuator system comprising a plurality of individually addressable actuators each being connected to the frame and configured to apply force to the lens cover in a direction at least substantially along the optical axis the lens cover being connected to the frame via the actuator system;
wherein the actuator system has a focus adjustment mode where the plurality of actuators are addressed to apply force to the lens cover in the same direction to adjust the optical power/Sag of the lens; and/or
wherein the actuator system has an optical image stabilisation mode where each of the one or more plurality of actuators are addressed to apply different forces to the lens cover in a manner that varies along the rim of the lens cover to tilt the optical axis of the lens, wherein the lens cover comprises one or more stiffeners, on its circumferential section serving to distribute strain and non-symmetrical deformations around the optical axis resulting from the applied forces over larger areas of the lens cover, wherein the actuator system is configured to operate in in the focus adjustment mode and the image stabilisation mode simultaneously by addressing each actuator to apply a force being at least substantially a sum of the forces that would be applied in these modes, and wherein the actuator system is configured to displace at least a part of the edge of the lens cover with respect to the frame.

2. The lens assembly according to claim 1, wherein the lens cover and/or the back window has a non-zero Sag.

3. The lens assembly according to claim 1, wherein the actuator system comprises at least three individually addressable actuators.

4. The lens assembly according to claim 1, wherein the actuator system comprises a plurality of individually addressable actuators, wherein the actuator system has a focus adjustment mode where all actuators are addressed to apply force to the lens cover in the same direction to adjust the optical power/Sag of the lens; and wherein the actuator system has an optical image stabilisation mode where actuators are addressed to apply different forces to the lens cover in a manner that varies along the rim of the lens cover to tilt the optical axis of the lens.

5. The lens assembly according to claim 1, wherein the actuator system in the focus adjustment mode can change the overall shape of the lens from a first overall shape where the lens has a first optical power to a second overall shape where the lens has a second optical power, and where a difference between the first and the second optical power, an optical power range, is at least 2 diopters.

6. The lens assembly according to claim 1, wherein the plurality of actuators are positioned next to the lens body, between the circumferential section of the lens cover and the back window.

7. The lens assembly according to claim 1, wherein the plurality of actuators each involve a cantilever with a first end connected to the frame and a second end configured to engage the lens cover to apply the force, and wherein each cantilever comprises a layer of piezoelectric material and the addressing of an actuator involves applying a voltage over the piezoelectric material.

8. The lens assembly according to claim 1, further comprising a central member positioned within or adjacent to the lens body and on the optical axis, the central member causing the lens body to provide a radial variation in reaction forces from the lens body when the lens cover is actuated in a direction towards the back window, the reaction forces decreasing with increasing radius.

9. The lens assembly according to claim 1, further comprising mechanical stops limiting the motion of the lens cover in directions at least substantially along the optical axis.

10. The lens assembly according to claim 9, wherein the mechanical stops are formed by parts of the frame and the one or more stiffeners on the circumferential section of the lens cover are positioned to be engaged by the mechanical stops.

11. The lens assembly according to claim 1, further comprising a first optical stop adjacent to the lens cover and a second optical stop adjacent to the back window, wherein the first and second optical stops are non-transparent and define circumferences of openings, which circumferences are normal to and concentric with the optical axis and define an optical aperture of the lens assembly.

12. The lens assembly according to claim 1, wherein the lens cover comprises one or more stiffeners on its circumferential section, wherein the actuator system comprises at least three individually addressable actuators, and wherein the at least three individually addressable actuators each being connected to the frame is each connected to the one or more stiffeners.

13. The lens assembly according to claim 1, wherein at least one of the plurality of individually addressable actuators forms an assembly with the frame.

14. An optical device comprising the lens assembly according to claim 1, wherein the optical device is any one of a camera, a microscope, binoculars, telescope, a pair of glasses, goggles, a wearable display, or a compact camera.

15. A mobile phone camera comprising a lens assembly according to claim 1, wherein the back window is a cover glass of the mobile phone camera.

16. A method for producing a lens assembly according to claim 1 comprising:
providing a frame,
providing at least one actuator, and
connecting the at least one actuator to the frame.

17. A method for producing a lens assembly according to claim 16, wherein:
providing at least one actuator,
comprises providing the at least one actuator separate from the frame.

18. A method of using the lens assembly according to claim 1 comprising:
adjusting focus of the lens assembly,
tilting an optical axis of the lens assembly, or
performing optical image stabilization of the lens assembly.

19. The lens assembly according to claim 1, wherein the lens cover and/or the back window has a non-zero Sag,
wherein the actuator system comprises at least three individually addressable actuators,
wherein the actuator system has a focus adjustment mode where all actuators are addressed to apply force to the lens cover in the same direction to adjust the optical power/Sag of the lens; and
wherein the actuator system has an optical image stabilisation mode where actuators are addressed to apply different forces to the lens cover in a manner that varies along the rim of the lens cover to tilt the optical axis of the lens.

* * * * *